US010600959B2

(12) United States Patent
Shi et al.

(10) Patent No.: US 10,600,959 B2
(45) Date of Patent: Mar. 24, 2020

(54) DOPANT-DRIVEN PHASE TRANSITIONS IN CORRELATED METAL OXIDES

(71) Applicant: PRESIDENT AND FELLOWS OF HARVARD COLLEGE, Cambridge, MA (US)

(72) Inventors: Jian Shi, West Lafayette, IN (US); You Zhou, Cambridge, MA (US); Shriram Ramanathan, West Lafayette, IN (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 15/026,592

(22) PCT Filed: Oct. 31, 2014

(86) PCT No.: PCT/US2014/063588
§ 371 (c)(1),
(2) Date: Mar. 31, 2016

(87) PCT Pub. No.: WO2015/066558
PCT Pub. Date: May 7, 2015

(65) Prior Publication Data
US 2016/0248006 A1    Aug. 25, 2016

Related U.S. Application Data

(60) Provisional application No. 61/899,153, filed on Nov. 1, 2013.

(51) Int. Cl.
*H01L 45/00* (2006.01)
*H01L 39/12* (2006.01)
*G11C 13/00* (2006.01)

(52) U.S. Cl.
CPC ........ *H01L 45/1206* (2013.01); *H01L 39/125* (2013.01); *H01L 45/08* (2013.01);
(Continued)

(58) Field of Classification Search
CPC ............. H01L 45/1641; H01L 45/1266; H01L 45/145; H01L 45/146; H01L 45/147; H01L 45/08; H01L 45/085; G11C 13/0007
See application file for complete search history.

(56) References Cited

U.S. PATENT DOCUMENTS 4,253,742 A * 3/1981 Morita ................. G02F 1/1525
359/270
6,136,704 A * 10/2000 Maya ................ H01L 21/28568
257/E21.168
(Continued)

OTHER PUBLICATIONS

Andreev et al. "Effect of Hydrogenation on the Metal Semiconductor Phase Transistion in Vanadium Dioxide Thin Films," Physics of the Solid State, 2007, vol. 49, No. 12, pp. 2318-2322.*
(Continued)

*Primary Examiner* — Matthew L Reames
*Assistant Examiner* — John A Bodnar
(74) *Attorney, Agent, or Firm* — Elizabeth Kim Patent Law Offices LLC

(57) ABSTRACT

Reversible phase transitions of exceptional magnitude may be induced in correlated metal oxides by altering their chemical compositions through reversible introduction of dopant ions and electronic carriers into the correlated metal oxides. One or more catalyst electrodes may be deposited onto a surface of a film of a correlated metal oxide such as a perovskite or a transition metal oxide. Dopant ions and electronic carriers may be electrochemically introduced into the catalyst-deposited correlated metal oxide, for example by annealing the catalyst-deposited film of correlated metal oxide in a chamber containing the dopant molecules. In this way, a reversible phase transition of about five to eight orders of magnitude may be induced.

14 Claims, 14 Drawing Sheets

(52) U.S. Cl.
CPC ........ *H01L 45/085* (2013.01); *H01L 45/1226* (2013.01); *H01L 45/146* (2013.01); *H01L 45/147* (2013.01); *H01L 45/1658* (2013.01); *G11C 13/0004* (2013.01)

(56) References Cited

U.S. PATENT DOCUMENTS

| | | | | |
|---|---|---|---|---|
| 2006/0050549 | A1* | 3/2006 | Adachi | G11C 13/0007 365/148 |
| 2006/0281277 | A1* | 12/2006 | Tamai | H01L 27/101 438/385 |
| 2007/0138463 | A1* | 6/2007 | Herlogsson | H01L 51/0516 257/40 |
| 2009/0110996 | A1* | 4/2009 | Shim | C23C 26/00 429/411 |
| 2011/0120855 | A1* | 5/2011 | Ramanathan | C23C 14/0036 204/192.15 |
| 2011/0181345 | A1* | 7/2011 | Ramanathan | G11C 11/16 327/509 |
| 2013/0292625 | A1* | 11/2013 | Sandhu | H01L 45/04 257/2 |

OTHER PUBLICATIONS

Andreev et al. (Effect of hydrogenation on the Metal-Semiconductor Phase Transition in Vanadium Dioxide Thin Films, physics of the Solid State, vol. 49, No. 12, 2007, pp. 2318-2322).*

Ha et al, Metal-Insulator Transition and Electrically Driven Memristive Characteristics of SmNiO3 Thin Films, Harvard, Nov. 2010, Applied Physical Letters 98, 2011.*

* cited by examiner

DOPANT-DRIVEN PHASE TRANSITIONS IN CORRELATED METAL OXIDES

CROSS-REFERENCE TO RELATED APPLICATIONS

This application is based upon a 35 U.S.C. § 371 National Phase Entry Application of International Application No. PCT/US2014/063588, filed Oct. 31, 2014, which designates the U.S., and claims the benefit of priority under 35 U.S.C. 119(e) from U.S. Provisional Patent Application Ser. No. 61/899,153 (the "'153 provisional application"), filed Nov. 1, 2013, entitled "Dopant-Driven Phase Transitions in Correlated Metal Oxides." The contents of each of these applications are incorporated herein by reference in their entireties as though fully set forth.

STATEMENT REGARDING FEDERALLY SPONSORED RESEARCH

This invention was made with government support under grants NSF DMR-0952794 and NSF CCF-0926148, awarded by the National Science Foundation. The government has certain rights in the invention.

BACKGROUND

Correlated electron systems possess complex electronic phase diagrams that are exceptionally sensitive to the orbital occupancy of electrons and chemical/carrier doping. In particular, electronic phase transitions observed in $RNiO_3$ perovskite nickelates (where R stands for rare earth lanthanide elements) are of broad interest in materials physics to understand band structure and oxide electronics such as but not limited to electronic switches.

In general, defects in oxide semiconductors make possible novel functionalities of great interest in resistance switching, superconducting, electrochromic and sensing devices. Correlated oxides are extremely sensitive to such defects, due to their sharp and nonlinear response on the shifting of strongly polarizable metal-oxygen bonds and strong correlations between valence electrons. The electronic properties of correlated oxides are exceptionally sensitive to chemical disorder.

Perovskite nickelates are correlated oxides with sharp thermally-driven insulator-metal transition. Among nickelates, $SmNiO_3$ (samarium perovskite nickelate, also referred to in this application as SNO) is the first rare earth nickelate with insulator-metal transition temperature $T_{IM}$ (~400 K) above room temperature, and is of great interest for the integration of correlated oxides with conventional circuits.

Conductance modulation in nickelates such as $SmNiO_3$ (SNO) is usually within one-two orders of magnitude across the transition boundary, which may originate from the subtle charge disproportionation. During the thermally driven phase transition in SNO, the $NiO_6$ octahedron buckles at below metal-insulator transition (MIT) temperature, which reduces the orbital overlapping and renders an insulating phase. Charge disproportionation has been proposed as the cause for SNO's insulating phase during thermally driven phase transitions in SNO.

Practically, however, resistance modulation in SNO as a cause of the thermally driven insulator-metal transition is usually limited to within only one-two orders (from room temperature to 200° C.). Also, the extremely short electrostatic screening length makes the resistance modulation challenging via electrostatic gating even with ionic liquids.

BRIEF DESCRIPTION OF THE DRAWINGS

In the present application, the terms "$SmNiO_3$" and "SNO" have the same meaning, namely samarium perovskite nickelate (i.e., samarium nickel tri-oxide), and are used interchangeably.

DETAILED DESCRIPTION

In the present application, methods and systems are described relating to dopant-driven phase transitions of exceptionally high magnitude induced in correlated metal oxides. As an example of a device based on such phase transitions, proton-gated transistors are disclosed that have exceptionally high on-off ratios.

Illustrative embodiments are discussed in this application. Other embodiments may be used instead. Many other related embodiments are possible.

In the present application, the terms "$SmNiO_3$" and "SNO" have the same meaning, namely samarium perovskite nickelate (i.e., samarium nickel tri-oxide), and are used interchangeably.

As described below, in the present application it is disclosed that by dissociating certain dopant molecules into dopant ions and electron carriers, then electrochemically incorporating the dopant ions and the electron carriers into a correlated metal oxide (as one example, by annealing the film in a chamber containing the dopant molecules), it is possible to alter the chemical composition of the correlated metal oxide and induce a reversible phase transition of exceptional magnitude in the correlated metal oxide.

As one example of an exceptionally large dopant-driven phase transition induced in a correlated metal oxide, hydrogen intercalation of $SmNiO_3$ (also referred to be SNO in this application) is illustrated in FIGS. 1A-1D, in accordance with some embodiments of the present application.

Figure 1A:
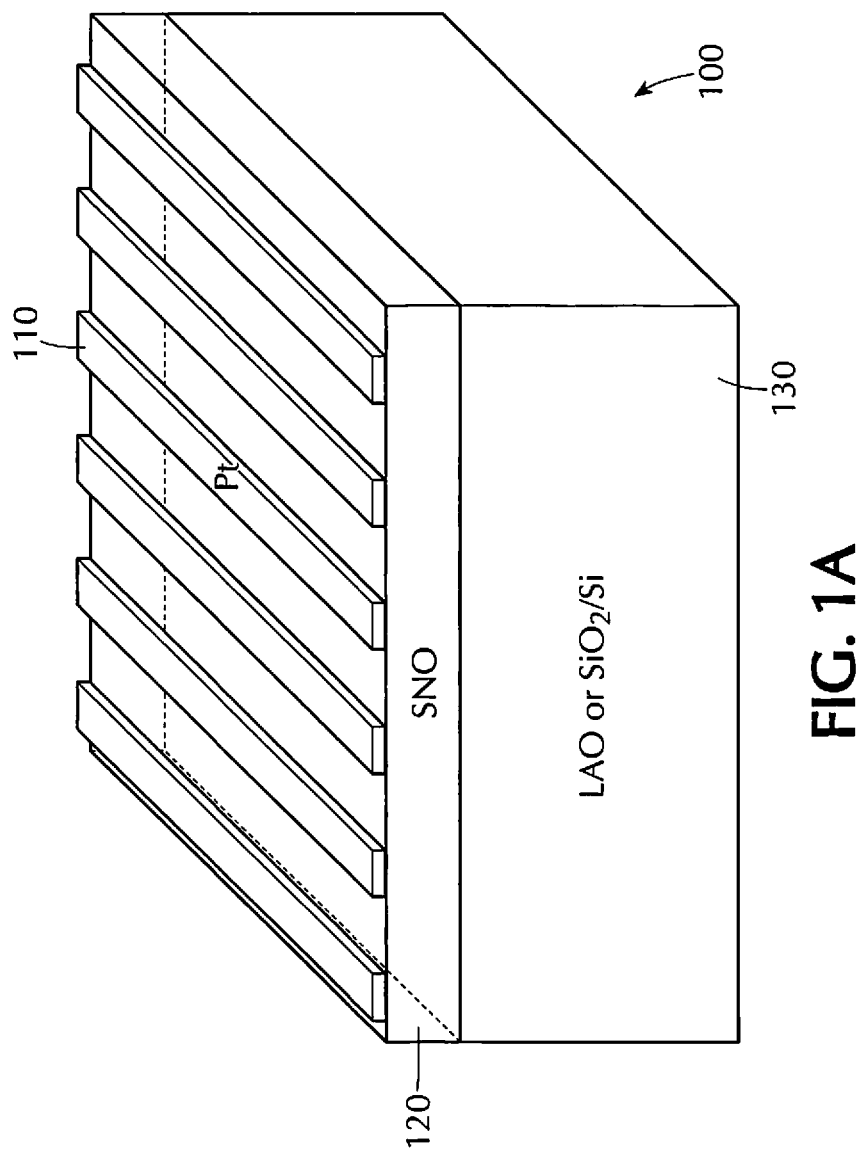
FIG. 1A provides a schematic illustration of Pt (platinum) catalyst patterns on SNO grown on a LAO (lanthanum aluminate) or a $SiO_2$/Si (Si (silicon) with a thermal oxide) substrate.

FIG. 1A provides a schematic illustration of an SNO sample 100, in which Pt catalyst patterns 110 are formed on SNO 120 grown on a LAO (single crystal lanthanum aluminate) or a $SiO_2/Si$ substrate 130. In the illustrated embodiment, LAO or Si with a thermal oxide (300 nm thick) have been used as growth substrate 130. Different materials, such as Ge (germanium) may also be used in other embodiments.

A combination of sputtering and ultrahigh pressure annealing was utilized for sample preparation, since the phase is not stable in ambient conditions. In the illustrated embodiments, the samples were synthesized by co-sputtering from metallic Sm (samarium) and Ni (nicketl) targets in $Ar/O_2$ atmosphere, which allows for precise control of the cation ratio.

In the illustrated embodiment, the growth of epitaxial and polycrystalline SNO was realized by physical vapor deposition followed by ultrahigh pressure annealing. The ultrahigh pressures are required for thermodynamic phase formation. Before sputtering, the substrate 130 LAO (or SiO2/Si or Ge wafer) was cleaned by acetone, isopropanol and DI (deionized) water and then dried by $N_2$ gas. For SNO deposition, co-sputtering with Sm and Ni metal targets was utilized. The growth was conducted at 5 mTorr in a constant flow of 40/10 sccm $Ar/O_2$ mixture with the substrate at room temperature. The d.c. power for the Ni target was adjusted to 75 W and radio frequency power for the Sm target was 150 W to obtain a ~1:1 Sm:Ni cation ratio, as determined by energy-dispersive X-ray spectroscopy. Growth time ranged from 30 min to a few hours to vary the film thickness.

The as-sputtered samples were then transferred to a home-built high pressure vessel system. The vessel was then inserted into a tube furnace and ramped to 500° C. for 24 h at 1,500 psi pure $O_2$. After annealing, the sample was cleaned by acetone, isopropanol and DI water and then dried by $N_2$. A series of Ce (cerium)-doped SNO samples with different doping concentration were grown on $SiO_2/Si$ by co-sputtering of $CeO_2$, Sm and Ni in $Ar/O_2$ atmosphere followed by identical high pressure post-annealing procedures as un-doped SNO. Ce concentration was controlled by varying the RF power to the target between 30 and 40 W.

While one example of an SNO sample synthesis procedure has been described above, other known sample synthesis processes may be used, in different embodiments of the present application.

Samples 100 (either SNO/LAO or $SNO/SiO_2/Si$, in the illustrated embodiment) were then patterned with Pt electrode arrays 110. In the illustrated embodiment, the width of each bar was 250 μm and their intervals 500 μm. In other embodiments, different sizes of the electrode arrays and the inter-electrode spacing may be chosen. The Pt serves as a catalyst, which adsorbs and dissociates hydrogen during hydrogenation process.

Figure 1B:
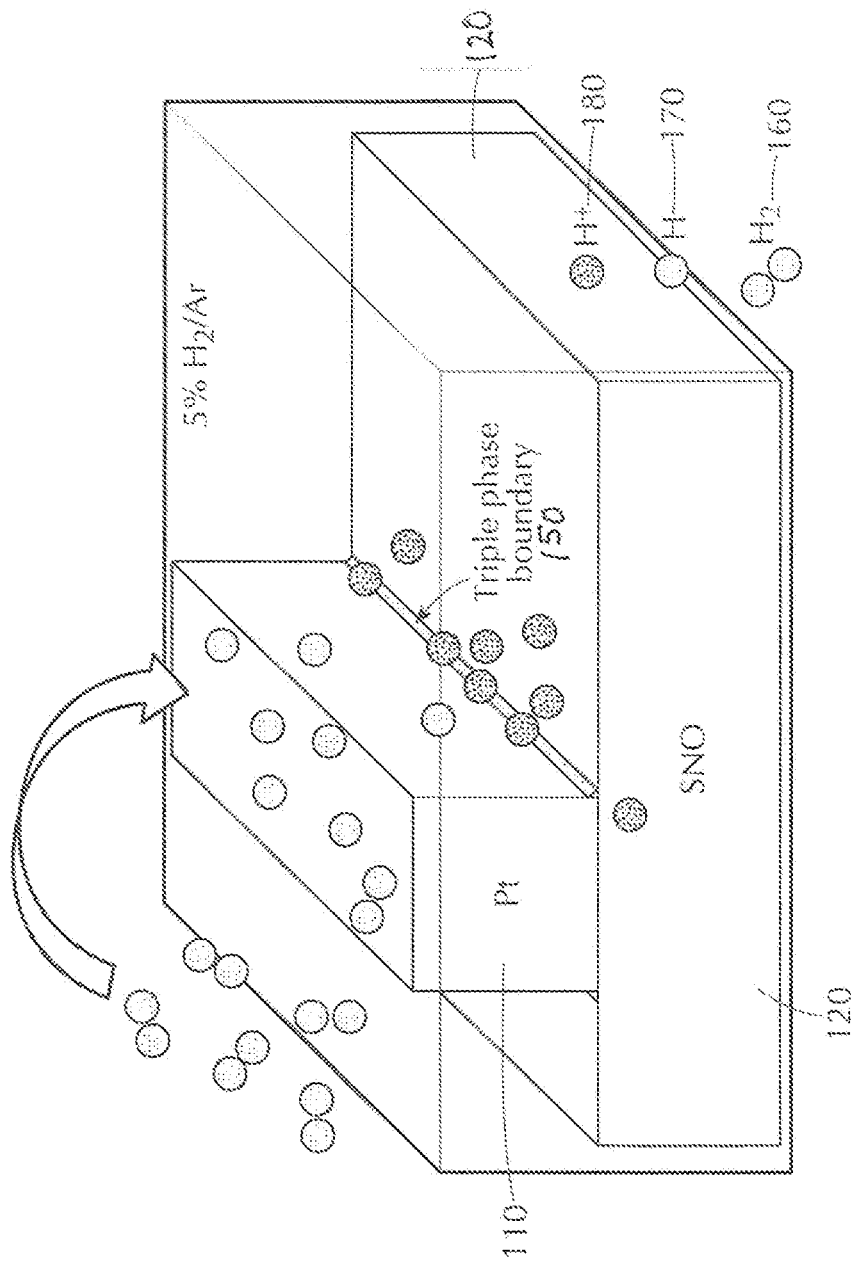
FIG. 1B schematically illustrates a proposed proton intercalation process in SNO.

In the illustrated embodiments, the observed phase transition was an electron doping-induced phase transition through hydrogenation or proton intercalation. FIG. 1B schematically illustrates the proposed proton intercalation process in SNO. At the triple phase boundary ($Pt-SNO-H_2/Ar$), indicated in FIG. 1B with reference numeral 150, $H_2$ 160 first dissociates to atomic hydrogen 170 and then splits to $H^+$ 180 and $e^-$, which are incorporated into the SNO lattice 120.

The samples 100 were then loaded in a home-made chamber and annealed at 200° C. in the hydrogen atmosphere (5% $H_2$ in Ar). Before the chamber temperature reaches 200° C., the chamber was filled with pure Ar. Upon hydrogen annealing, for the SNO/LAO sample, SNO regions in the vicinity of Pt bars 110 became optically transparent, while the region further away from the Pt bars 110 was still in its original dark color.

Figure 1C:
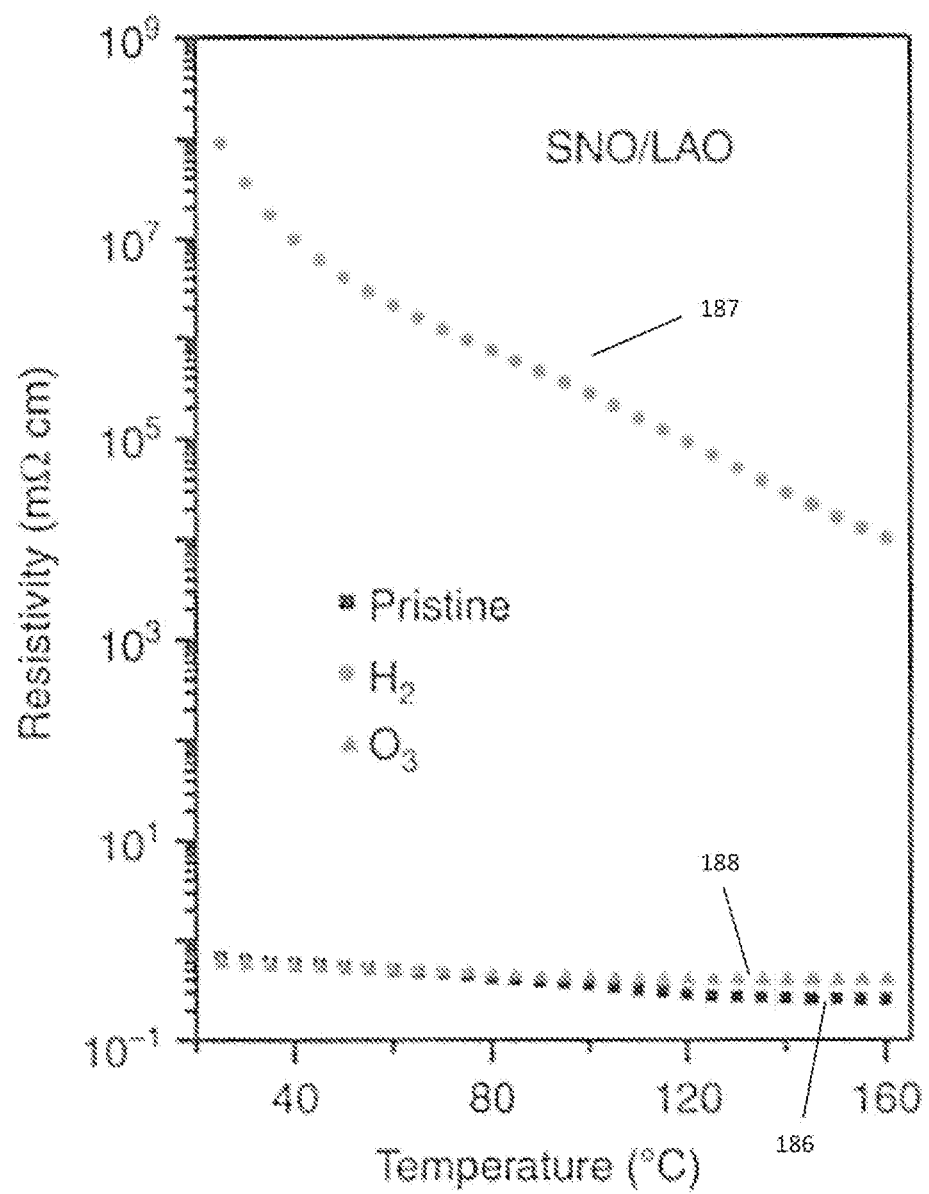
FIGS. 1C and 1D present the colossal resistance change of SNO on its exposure to hydrogen.
Figure 1D:
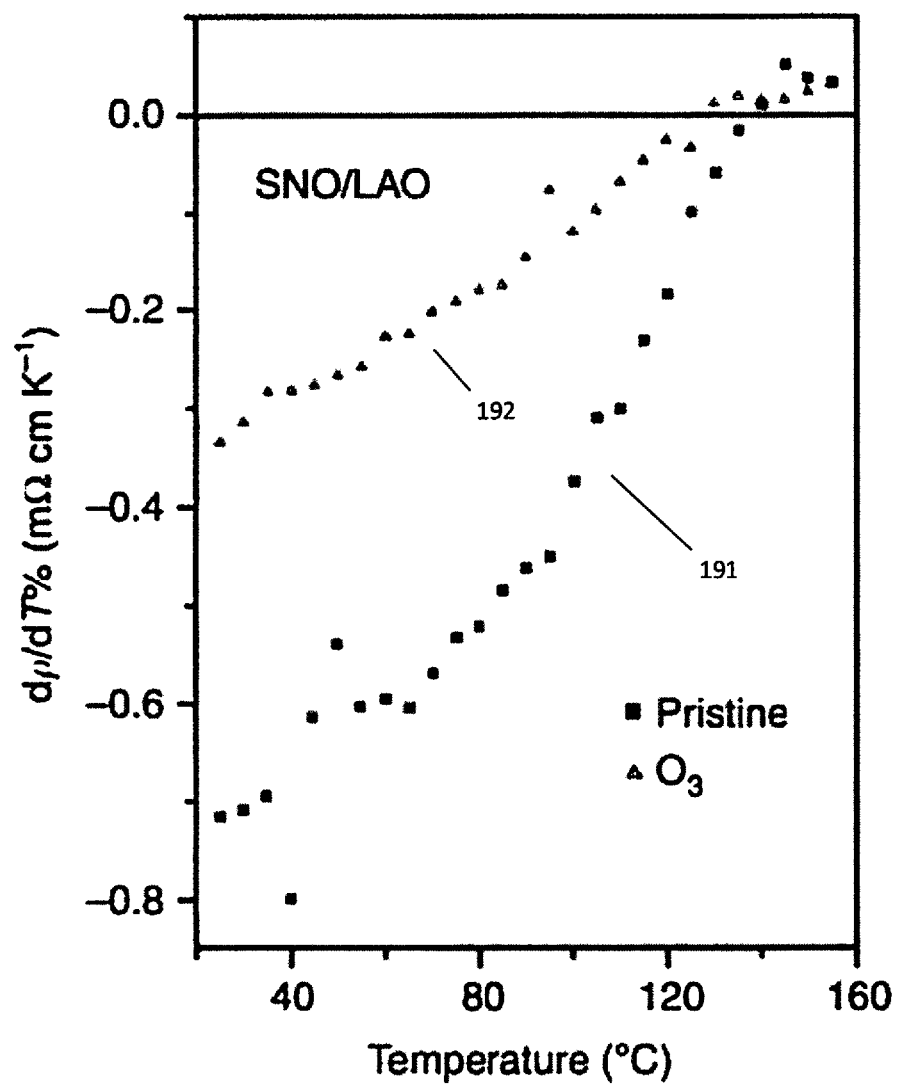

FIGS. 1C and 1D present the colossal resistance change of SNO on its exposure to hydrogen. Specifically, FIG. 1C is a plot of the resistivity versus temperature for pristine SNO (curve 186 of rectangles), hydrogenated SNO (curve 187 of circles) and ozone-annealed SNO (curve 188 of triangles) on a LAO sample, respectively, recorded in air. FIG. 1D shows the derivative of resistivity versus temperature, plotted as a function of temperature for pristine SNO (curve labeled 191) and ozone-annealed SNO (curve labeled 192) on an LAO sample recorded in air.

In the illustrated embodiment, all the resistivity-temperature (R-T) data were collected in ambient atmosphere. As described below in conjunction with FIGS. 2A and 2B, pristine SNO on LAO showed a typical MIT characteristic with its transition temperature at ~140° C., close to its bulk value. The resistivity of pristine SNO at 25° C. is 0.6 mΩ·cm. Upon 15 minutes 5% $H_2/Ar$ annealing at 200° C., the resistivity of SNO sample (at room temperature) increases to $10^8$ mΩ·cm and drops slowly at ambient conditions ($>10^7$ mΩ·cm after several days).

Figure 2A:
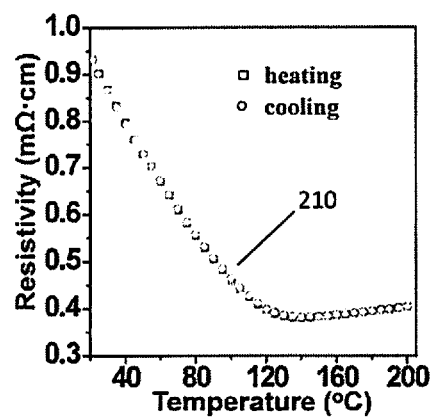
FIGS. 2A and 2B illustrate the MIT (metal-insulator transition) behavior of pristine SNO.
Figure 2B:
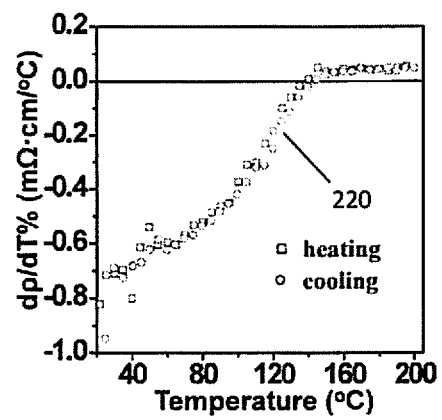

FIGS. 2A and 2B illustrate the MIT behavior of pristine SNO. FIG. 2A shows the resistivity-temperature characteristics 210 of pristine SNO. The resistivity-temperature curve 210 shows a typical MIT characteristic of SNO collected from at room temperature (25° C.) to 200° C. FIG. 2B presents the calculated derivative of resistivity with respect to temperature 220, namely dp/dT, versus temperature (T), which exhibits a MIT temperature ~140° C. (defined by the change of sign), as consistent with the reported bulk value.

Figure 3A:
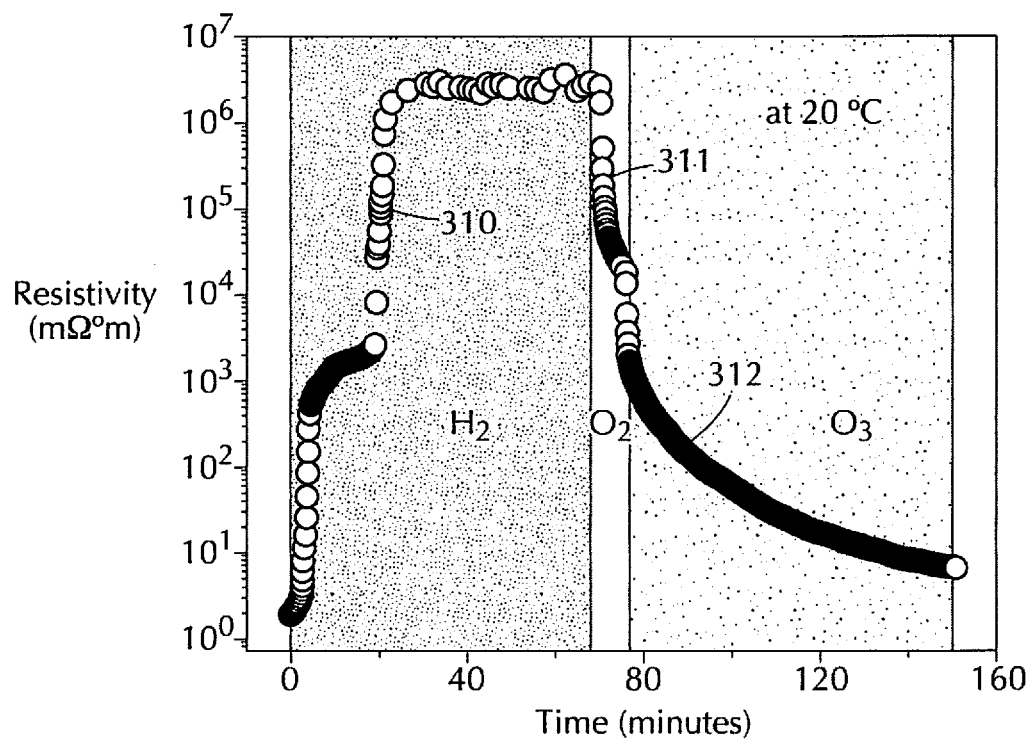
FIGS. 3A and 3B illustrate real-time monitoring of resistivity evolution at different annealing conditions.
Figure 3B:
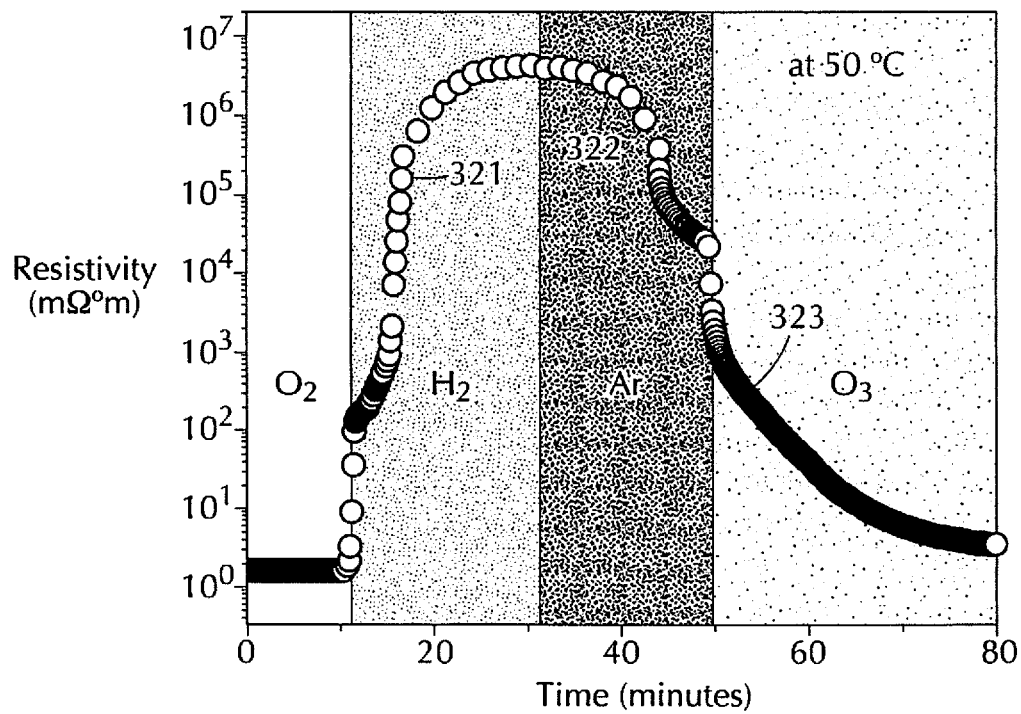

FIGS. 3A and 3B illustrate real-time monitoring of resistivity evolution at different annealing conditions. FIG. 3A illustrates the resistivity of SNO versus time exposed in $H_2$ (curve portion labeled 310), $O_2$ (curve portion labeled 311) and $O_3$ (curve portion labeled 312) in sequence at 20° C., whereas FIG. 3B illustrates the resistivity of SNO versus time exposed in $O_2$ (curve portion labeled 320), $H_2$ (curve portion labeled 321), Ar (curve portion labeled 322) and $O_3$ (curve portion labeled 323) in sequence at 50° C.

In the illustrated embodiments, real-time measurements were conducted to monitor the resistivity evolution during the hydrogen annealing process. Prior to the measurement, the sample ($SNO/SiO_2/Si$) was sealed in a pure Ar filled chamber. The resistivity is monitored versus time immediately after the $H_2/Ar$ gas is introduced into the chamber with 150 sccm flow rate.

Curve portion 310 in FIG. 3A shows that initially at 20° C., the resistivity of the sample increases drastically from $10^0$ mΩ·cm to $10^3$ mΩ·cm within 10 minutes,. The resistivity then slowly escalates for ~10 minutes, after which it shoots up quickly again and reaches a constant value ($>10^6$ mΩ·cm), rendering a final on/off ratio of more than six orders of magnitude. By turning off $H_2$ and introducing $O_2$ and $O_3$ in sequence at 20° C., the resistivity recovers to its original value, as shown by the curve portion 312.

Curve portions 321 and 322 in FIG. 3B show that at 50° C., a similar phenomenon was observed after the introduction of $H_2/Ar$ except that the whole transition process proceeds faster than at 20° C. When its resistivity reaches a high value ($>10^6$ mΩ·cm), $H_2$ was turned off and Ar was introduced to unveil SNO's non-volatility in inert atmosphere. As seen in curve portion 322, the resistivity first drops slowly (in first ~10 minutes) and then quickly (in ~2 minutes) and eventually stabilizes ($>10^4$ mΩ·cm) in an asymptotical manner.

Immediately after the purge of $O_3$, the resistivity returns to its original value after a few hours, in a fashion similar to the 20° C. case. The extreme sensitivity of SNO to proton intercalation at various temperatures (ranging from room temperature to at least 200° C.) makes it a promising candidate for ionically mediated switching and synaptic electronics compatible with contemporary CMOS technologies. Along the resistivity ramp path both at 20° C. and 50° C., there is always a short "stand" where resistivity escalates quite slowly. This "stand" region begins at $5 \times 10^2$ mΩ·cm at 20° C. (see curve portion 310) and $1 \times 10^2$ m·cm at 50° C. (see curve portion 321). The emergence of this region suggests the possible existence of a metastable H-SNO phase with varying hydrogen concentration in SNO.

Figure 3C:
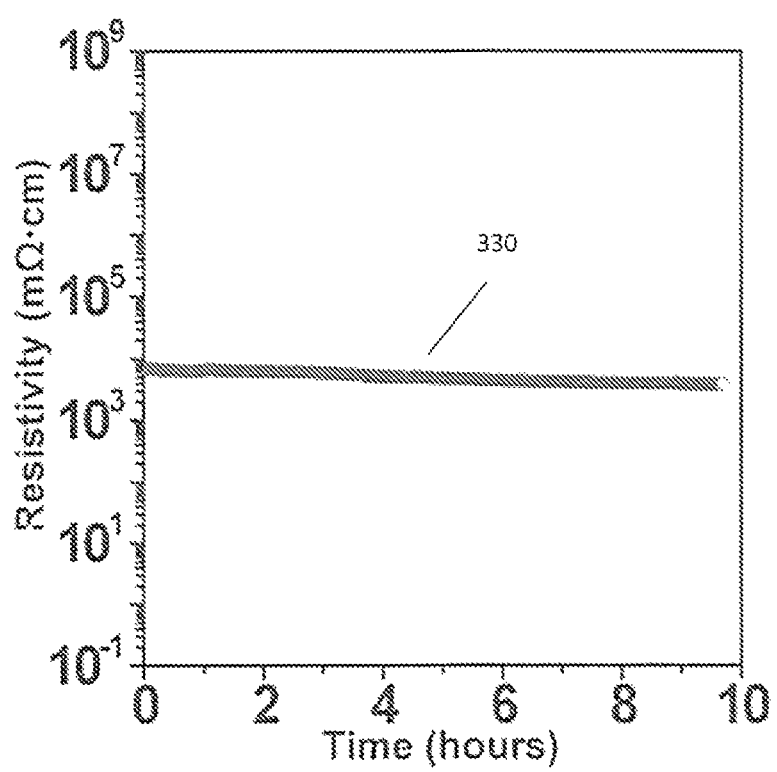
FIG. 3C illustrates the resistivity retentivity of SNO sample annealed (in $H_2$ (hydrogen molecule)/Ar (argonne)) at reduced temperature (100° C.).

FIG. 3C illustrates the resistivity retentivity 330 of a SNO sample annealed (in $H_2$/Ar) at a reduced temperature (100° C.). FIG. 3C shows that the hydrogenation process is non-volatile at elevated temperature for several hours. Reasonably long retention time of an ionic switching device is crucial for relevance to neural electronics and circuits. To demonstrate such behavior, the pristine SNO sample was first annealed in 5% $H_2$/Ar at 100° C. for 1 minute and then its resistivity was measured for several hours at ambient. As seen in FIG. 3C, the resistivity of H-SNO decreases slowly and still holds the same order of magnitude after eight hours.

In the illustrated embodiments, the above-described hydrogenation process was found to yield a colossal resistance change of $>10^8$ orders of magnitude, and non-volatility at ambient conditions.

To recover the resistivity, the H-SNO sample may be annealed in $O_3$, a highly oxidizing environment, for 10 hours at 300° C. Varied annealing temperatures and durations were attempted to explore the resistivity recovery properties. Resistivity-temperature characteristics, measured after the hydrogenated SNO is exposed to different ozone conditions, revealed that ozone annealing can recover the original conductivity by extracting hydrogen from SNO. A longer ozone annealing duration, namely a duration that is expanded from five to ten hours with temperature fixed to be 300° C., was found to further reduce the resistivity of SNO, indicating the additional release of protons. At higher annealing temperature (400° C.), its resistivity was found to decrease further, due to the release of protons.

Resistivity versus temperature measurements have thus shown that the resistivity returns to the normal value for stoichiometric SNO. Its typical MIT characteristic also suggests the recovery of SNO. Cycling testing by following the above-described annealing path generated reproducible results.

In some embodiments, identical measurements may also be conducted on other samples, such as SNO/$SiO_2$/Si and SNO/$GeO_x$/Ge samples. Similar performance was shown.

Figure 4:
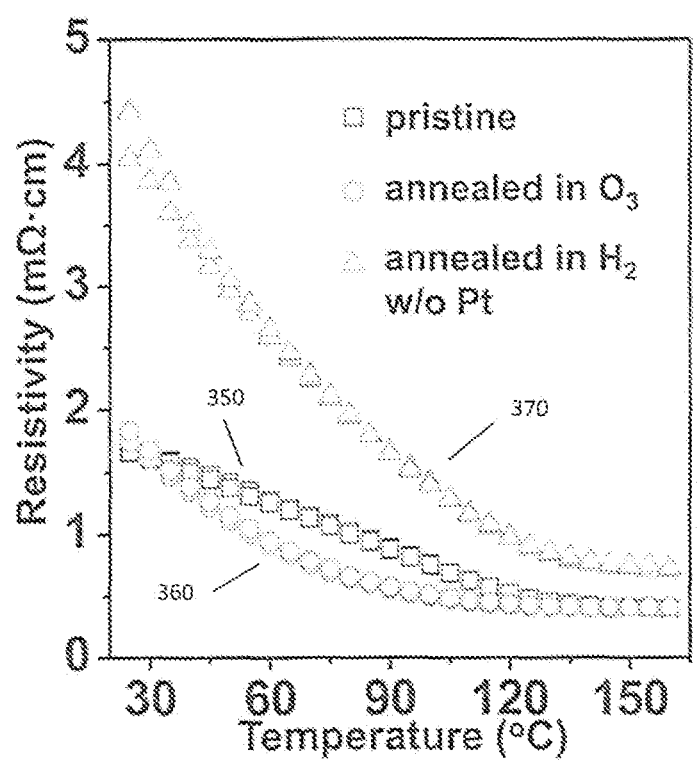
FIG. 4 illustrates the resistance change with temperature for pristine SNO, SNO annealed in $O_3$ (ozone), and SNO annealed in $H_2$ without Pt, respectively.

It should be noted that without Pt, there is no significant change in the resistivity or R-T characteristic of SNO after hydrogen annealing. This is demonstrated in FIG. 4, which illustrates the resistance change with temperature for pristine SNO (curve 350, composed of squares), SNO annealed in $O_3$ (curve 360, composed of circles), and SNO annealed in $H_2$ without Pt (curve 370, composed of triangles).

Pt, together with Pd, are well-known catalysts for dissociating $H_2$. Without the catalyst (Pt), negligible hydrogenation effect was found, as demonstrated in FIG. 4. The resistance change is only a factor of 2-3. To illustrate the catalytic effect of Pt during SNO's hydrogenation process, a SNO sample without any Pt array pattern was annealed at 200° C. in 5% $H_2$/Ar gas for 15 minutes. As demonstrated by the triangle curve 370 in FIG. 4, only a very small change of resistivity was observed in the absence of catalyst.

Structural analyses of the above described proton-driven metal insulator transitions have been conducted. They have confirmed that there is no drastic structural change accompanying the above-described phase transition. Electron diffraction patterns showed that the crystal structures of pristine SNO, and H-SNO prepared by hydrogenation at 200° C. for 15 minutes, are identical within the resolution of the technique. After $O_3$ annealing at 300° C. for 10 hours to recover SNO's resistivity, its crystal structure remains unchanged as well. High-resolution X-ray diffraction (XRD) were also performed to confirm the polycrystalline nature of SNO on SiO2/Si substrate. High-resolution XRD characterization also indicated no noticeable change of lattice parameters of SNO.

Figure 5:
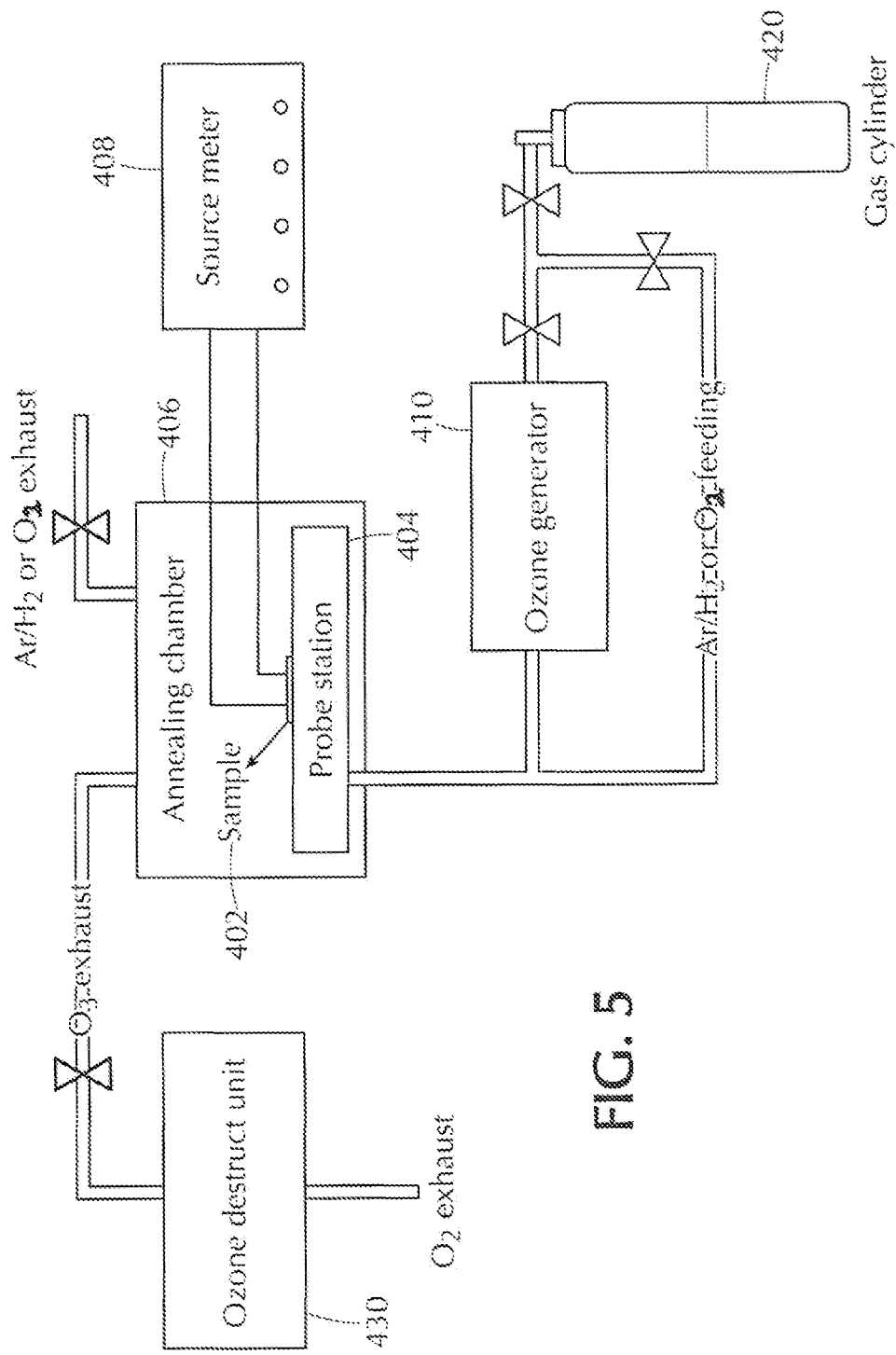
FIG. 5 schematically illustrates one example of an experimental setup for hydrogenation and ozone annealing.

FIG. 5 schematically illustrates one example of an experimental setup 400 for hydrogenation and ozone annealing described above. The illustrated experimental setup 400 is a customized setup for hydrogenation and in-situ ozone annealing while simultaneously performing electrical transport measurements. It should be noted that what is described below is only one example of an setup for hydrogenation and annealing, and many different types of experimental apparatuses can be used in other embodiments.

In this example, the sample 402 was located inside an annealing chamber 406 on a sealed probe station 404 with heating capabilities for transport measurements. As seen in FIG. 5, the annealing chamber 406 is connected to a source meter 408 with which electrical measurements were conducted, an ozone generator 410 that generated ozone, and a gas cylinder 420 from which Ar, $H_2$ or $O_2$ gases are fed into the chamber. In the illustrated embodiment, an environmental probe station 404 (made by Materials Development Corporation) was utilized for resistance-temperature or transistor measurements with the SNO device exposed to ambient conditions. A custom-designed annealing chamber 406 was used, where Ar, $H_2$ or $O_3$ (generated by the ozone generator 410) gases were regulated at 150 sccm, to monitor the resistance evolution of SNO during the hydrogenation and $O_3$ annealing processes.

In the illustrated embodiment, the source meter 408 was a Keithley 2635 A source metre. Gate bias was applied with a Keithley 230 voltage supply. Compressed oxygen gas was supplied to the ozone generator 410 at 10 psi with a flow rate of 150 sccm for ozone annealing. An ozone destruct unit 430 was connected to the ozone exhaust. The entire probe station 404 was anchored in a fume hood for safe operation. Equipment setup was in a safe fume hood controlled space, as performing electrical measurements in ozone at elevated temperatures require great care. In this example, annealing in chlorine gas was conducted at 200° C. for 5 minutes. Chlorine gas was controlled through a CGA 660 regulator at a flow rate of 10 sccm in a dedicated gas line. In other embodiments, different types of annealing processes may be used.

It is generally recognized that, in electrochromic processes involving hydrogenation such as in monoclinic $WO_3$, the proton binds to the oxygen and the electron reduces cation valence from $W^{6+}$ to $W^{5+}$. The newly formed compound $H_xWO_3$'s distinct optical and electrical properties derive from the reduced W ion form $W^{5+}$. Recently, electrochromic bleaching of $Ni_2O_3$ to NiO and α-Ni(OH)$_2$ was realized upon hydrogen annealing, where hydrogen was proposed to serve as a reducing species. Similarly, in the hydrogenation process, it is possible that SNO's $Ni^{3+}$ could be reduced to $Ni^{2+}$. It has been reported that the existence of large fraction of $Ni^{2+}$ leads to extremely poor conductivity of SNO. In addition, SNO's insulating state is proposed to be originated from the charge disproportionation:

$$2Ni^{3+} \rightarrow Ni^{3+\delta} + Ni^{3-\delta},$$

where the covalent character of Ni—O bonding, manifested by (3-δ), is an important factor that determines the band gap of its insulating state. In either scenario, the deviation of nickel's valence state from three to a lower value [2 or (3-δ)] could result in the steep increase of SNO's resistivity. Based on extant literature and the above experimental observations, the large resistance modulation observed may stem from the following reversible electrochemical process:

$$Sm^{3+}+Ni^{3+}3O^{2-}+H^{+}+e^{-} \leftrightarrow Sm^{3+}+Ni^{2+}2O^{2-}+OH^{-}. \qquad (1)$$

The symbol $OH^{-}$ here is used to express a likely position of proton which is often located on the oxygen (as the case in $WO_3$ and $Ni_2O_3$).

The above-described exceptionally high phase transitions, which were chemically induced by dopant introduction, can allow for useful systems and devices to be constructed. In general, these systems may include a film of a correlated metal oxide, where one or more catalyst electrodes are deposited onto the surface of the film, and dopant molecules. The dopant molecules are dissociable into dopant ions and electronic carriers, so that the dopant ions and the electronic carriers are can be electrochemically incorporated (in a reversible manner) into the correlated metal oxide and alter the chemical composition of the correlated metal oxide, thereby inducing a reversible phase transition (for example, a metal-insulator transition) of the correlated metal oxide. The phase transition comprises a non-volatile change in resistivity of at least five orders of magnitude, and as large as eight orders of magnitude.

In some embodiments, the dopant molecules are dissociable into dopant ions and electronic carriers by annealing of the catalyst-deposited film in a chamber containing the dopant molecules.

The correlated metal oxide may be a perovskite such as SNO, or a transition metal oxide (such as titanium oxide), or a rare earth nickelate such as SNO. The film of the correlated metal oxide may have nanoscale dimensions.

In some embodiments, the dopant molecules are hydrogen, the dopant ions are protons, and the catalyst electrode is a hydrogen catalyst electrode (for example Pt or Pd (palladium) electrodes). The catalyst electrode may be dense or porous.

As one example, solid-state proton-gated transistors are disclosed that are based on the above-described chemically driven phase transitions, and that have unprecedentedly high on-off ratios.

In some embodiments of the present application, a solid state room temperature transistor, which is a proton-gated emergent phase transistor with SNO channel is designed, fabricated and operated with Y-doped barium zirconate, a canonical proton conductor. In these embodiments, the proton-gated transistor utilizes the reversible and nonvolatile switching behavior between $Ni^{2+}$ and $Ni^{3+}$ in SNO, and which shows a very large on/off ratio.

As described below, this proof-of-concept transistor confirms the role of protons in resistivity modulation and suggest the potential for such a phenomenon in ionic switches towards brain-inspired electronics.

In overview, the proton-gated transistors described below include a proton conducting layer that is grown on top of a layer of correlated metal oxide, the proton conducting layer being also an electron insulator. A proton-permeable gate electrode is grown on top of the proton conducting layer, and source and drain electrodes are patterned.

FIGS. 6A-6E illustrate a solid state proton-gated $SmNiO_3$ transistor, in accordance with some embodiments of the present application.

Figures 6A, 6B:
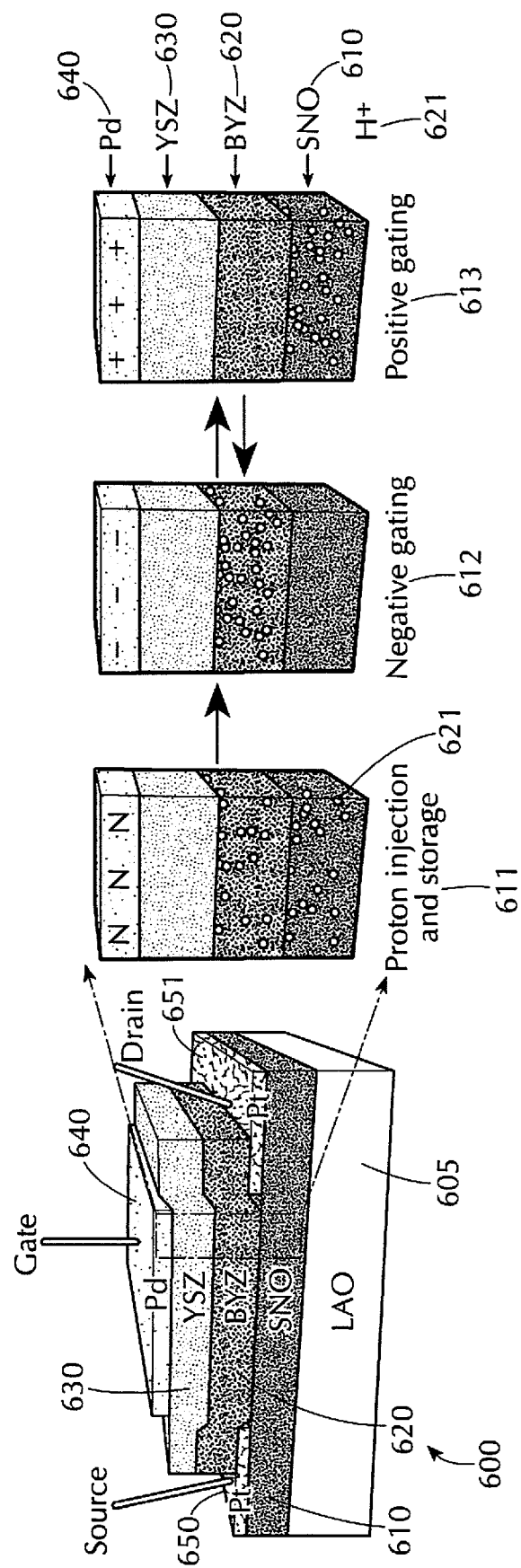
FIGS. 6A-6E illustrate a solid state proton-gated $SmNiO_3$ transistor, in accordance with some embodiments of the present application.

FIG. 6A is a schematic illustration of a layout of the solid state proton SNO transistor 600, where SNO serves as channel layer 610, BYZ (yttrium-doped barium zirconate) as proton reservoir 620, YSZ (yttria-stabilized zirconia) as proton transport barrier 630, Pd as gate 640 and $H_2$ dissociation catalyst, and Pt as source and drain electrodes 650 and 651. In this embodiment, the three-terminal SNO transistor device 600 was fabricated using photolithography. Fabrication methods other than photolithography may be used in different embodiments of the transistor device 600.

In this example, a pristine SNO bar 610 was first patterned on an LAO substrate 605 by photolithography. In the illustrated embodiment, dilute hydrogen chloride (3:1$H_2$O:HCl) was used to etch SNO. 100 nm thick Pt electrodes were prepared by DC sputtering for ohmic electrical contact and good mechanical adhesion. Two Pt electrodes were sputtered on SNO as the source and drain terminals 650 and 651. Pt also serves as catalyst for hydrogen dissociation, as emphasized above.

Then a low temperature proton conductor BYZ, shown in FIG. 6A with reference numeral 620, was grown on top working as a proton reservoir/conductor to store/transport protons. BYZ 620 of 60 nm and YSZ 630 of 100 nm were then sputtered on top covering the SNO bar and partial Pt electrodes. Above it, YSZ 630 was deposited to serve as a barrier to prevent escape of hydrogen from BYZ/SNO system into atmosphere. Extensive experiments were carried out to determine optimal deposition conditions for the growth of the gate stacks. Both layers were deposited by the magnetron RF sputtering of 100 W with 40 sccm Ar at 5 mTorr. To enable good crystallinity of BYZ, the substrate temperature was adjusted to be 500° C. across BYZ deposition. The substrates were not heated during YSZ deposition.

Afterwards, photolithography was used to pattern the Pd gate electrode 640 on top of the YSZ 630. In this example, e-beam evaporation was used to deposit a thin (40 nm) layer of Pd. In this example, the evaporated Pd gate electrode 640 served as both proton conductor and catalyst for hydrogen dissociation.

FIG. 6B illustrates a proposed working principle of the protonic transistor 600. First, during a proton injection and storage stage 611 one injects protons 621 into the BYZ reservoir 620 and the SNO channel 610 by $H_2$ annealing. Then, during a negative gating stage 612, one extracts protons 621 from the SNO channel 610 to the BYZ reservoir 620 by a negative gating bias. Finally, during a positive gating stage 613, one drives protons 621 from the BYZ reservoir 620 into the SNO channel 610 by a positive gating bias.

First, hydrogen molecules dissociate at the gate electrode 640 and the produced protons diffuse into BYZ 620 and SNO 610, driven by the density gradient. The proton diffusion process proceeds preferably at elevated temperature, for example, 200° C., due to enhanced ionic conductivity of BYZ 620 and YSZ 630. Below 100° C., during the hydrogenation process, the resistivity of SNO 610 is barely modulated, due to the existence of a proton conduction barrier. At 200° C., the resistivity of SNO 610 increases by several orders in less than one minute.

Second, when a negative bias is applied to the Pd gate electrode 640, the majority of protons 621 in SNO 610 are attracted to BYZ 620 under the electric field. At this state, the SNO body's protons are removed and its $Ni^{3+}$ recovers due to charge neutrality. Its resistivity is low and the transistor's state is "on."

Finally when a positive bias is applied, protons 621 are pushed to SNO body 610, which is accompanied by the reduction of $Ni^{3+}$ to $Ni^{2+}$ resulting in a high resistivity state of SNO, i.e., transistor's "off" state. In both operations 612 and 613, duration of gate pulses determines the amount of protons intercalated in SNO body and further realizes the analog-state resistivity control. The electrochemical nature of the proton intercalation makes the device's non-volatile characteristics possible.

Figure 6C:
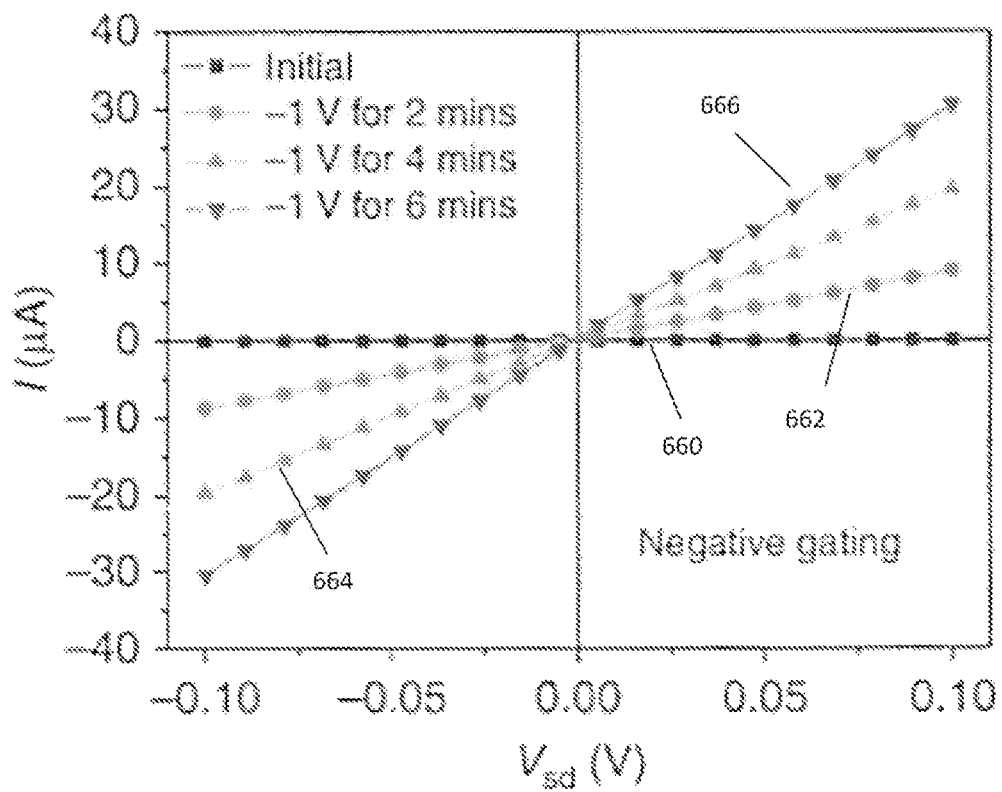
Figure 6D:
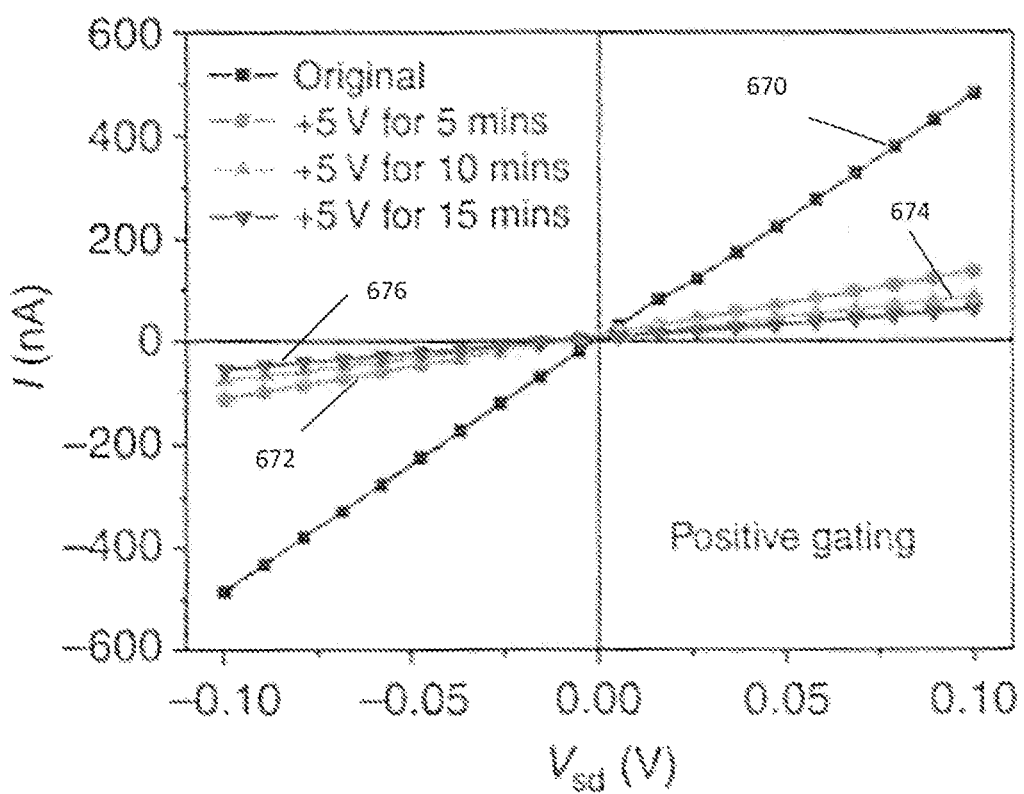

FIG. 6C and 6D illustrate current versus source-drain voltage of protonic SNO transistor subject to negative gate bias (FIG. 6C) and positive gate bias (FIG. 6D) for different durations.

FIG. 6C plots the current versus source-drain bias under varied negative gate durations. Line 660 shows the initial source-drain bias. Lines 662, 664, and 666 show the source-drain bias under a −1 V gate bias for 2, 4, and 6 minutes respectively. After 30 seconds proton injection at 200° C., the channel resistivity increases from <1 to ~$2 \times 10^3$ mΩ·cm. It is found that a large amount of hydrogen gas pockets develop cumulatively during the anodic reaction of SNO under negative gating, which eventually leads to the rupturing of Pd layer. Overloaded protons facilitate this blistering process and under-loading helps to prolong the lifetime of the Pd electrode.

After initial proton injection, a −1V gate bias with increased durations in geometric sequence (2 minutes (line 662), 4 minutes (line 664), and 6 minutes (line 666)) is applied. These gate biases demonstrated that the channel sheet resistance decreases (from $2.4 \times 10^8$ Ω/per square) drastically in the first two minutes and then slowly afterwards. Eventually, it reduces to $6.6 \times 10^5$ Ω/per square after six minutes gating, which is at least two orders of magnitude in resistivity modulation. Further negative gating is avoided to protect the Pd electrode from blistering by anodic reaction.

To demonstrate the "turn off" ability, the device can be operated in a narrower modulation window to prevent failure of electrodes. In FIG. 6D, line 670 shows the initial source-drain bias. Lines 672, 674, and 676 show the source-drain bias under a +5 V positive gate bias for 5, 10, and 15 minutes respectively.

A short negative gate bias pulse is first applied on the as-annealed sample to retract the proton from SNO to BYZ, leading to the sheet resistance value dropping to $4.1 \times 107$ Ω/per square. Then a +5 V gate bias with increased durations in geometric sequence (5 minutes (line 672), 10 minutes (line 674), and 15 minutes (line 676)) is applied. The resistance in the first five minutes gating increases a bit quickly (see line 672) and increases slowly afterwards, exhibiting a distinct gating rate from the "turn on" process. After 15 minutes gating, the channel resistance reaches $3.3 \times 108$ Ω/per square, demonstrating almost one-order gating capability.

Figure 6E:
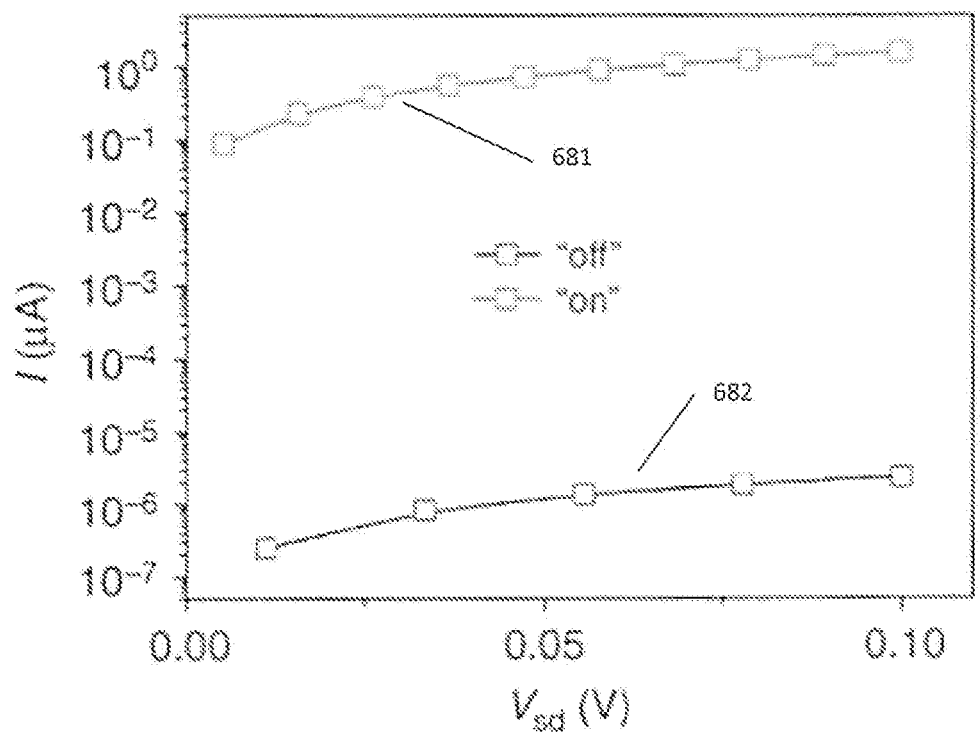

FIG. 6E is a plot of current versus source-drain bias, showing an exceptionally high (>$10^5$) on/off ratio. In FIG. 6E, the "on" curve is shown with reference numeral 681, while the "off" curve is shown with reference numeral 682. An exceptional on/off ratio, higher that $10^5$, is clearly shown. By increasing the proton injection time to 15 minutes and prolonging the negative gating bias to 10 minutes, five orders of resistivity switching window was thus realized. The polarity dependence of channel resistance on gate bias indicates that it is the $H^+$ that is serving as transport carrier.

The experimental observations from the operational characteristics of SNO transistor therefore further consolidate the phase transition model proposed and described above. The solid-state proton-gated transistor, highlighted by its non-volatility, analogue states and large switching window, room temperature operability could be of further interest for synaptic electronics compatible with CMOS technologies. As these devices can operate over a broad temperature range, they may be monolithically integrated with traditional electronic circuits.

It should be understood that the correlated nickelate $SmNiO_3$ is only one illustrative example of correlated systems in which the above-described non-volatile changes in resistivity can be induced. In other embodiments, such phase transitions may be induced in different types of correlated systems, including without limitation: many different types of perovskites, transition metal oxides, and rare earth nickelates. Also, while the phase transition was induced by hydrogenation, other mechanisms (for example Li or Mg (magnesium) intercalation) can also induce similar phase transitions, as further described below in conjunction with FIG. 7.

Figure 7:
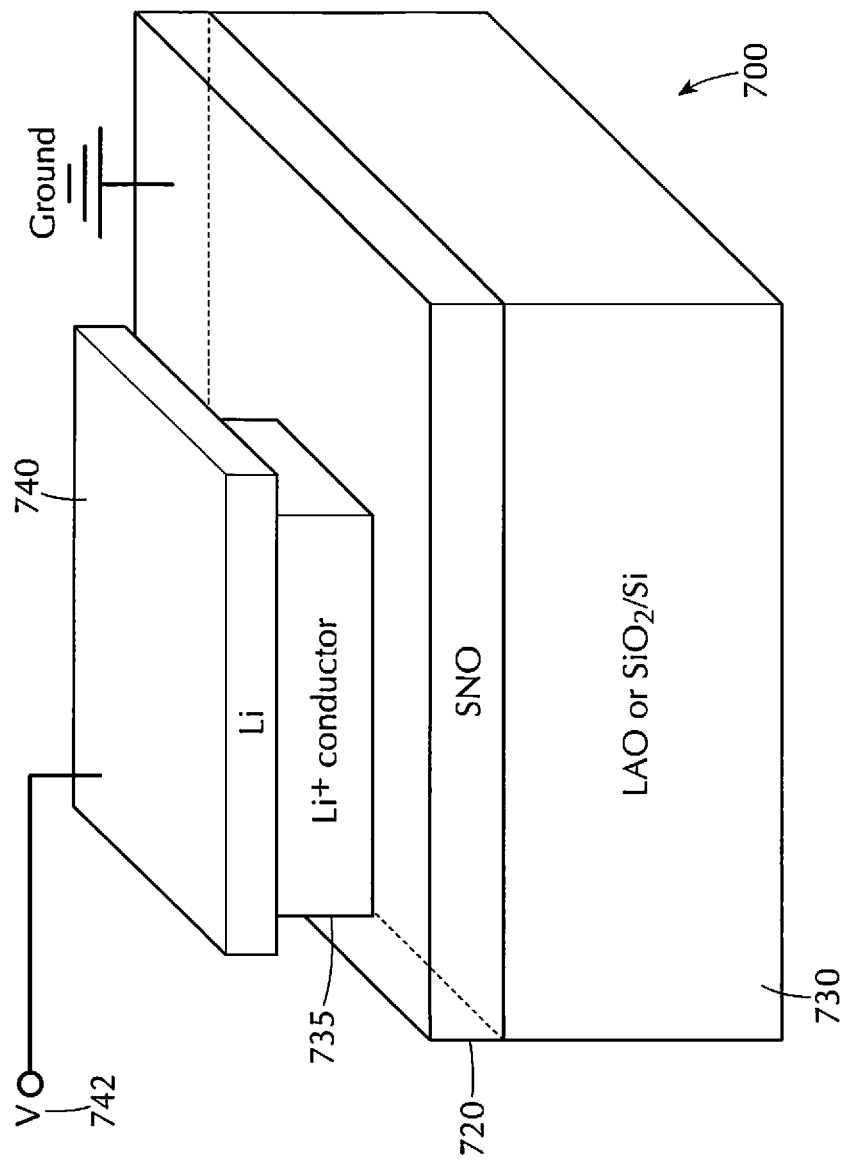
FIG. 7 schematically illustrates Li (lithium) intercalation in SNO.

As illustration that dopant molecules other than hydrogen, such as electron donor alkaline metal Li, can also give rise to similar sharp phase transitions, FIG. 7 schematically shows Li intercalation in SNO. Electrons from the metal Li can be incorporated into the $e_g$ orbital of $Ni^{3+}$ to form a $Ni^{2+}$ of high spin configuration in the $e_g$ orbital and $Li^+$ binds with oxygen ion. As disclosed below, such a process is able to reproduce the observations in hydrogenated SNO.

FIG. 7 provides a schematic drawing of the electron doping of SNO via Li intercalation utilizing an electric double layer transistor (or electrochemical cell) device 700. The device 700 includes an SNO layer 720 on a LAO (or $SiO_2$/Si) substrate 730. A $Li^{30}$ electrolyte 735, which in the illustrated embodiment is saturated lithium perchlorate in propylene carbonate, is disposed between the SNO layer 720 and a Li metal plate gate 740. The Li metal gate is connected to a voltage source 742.

It was found that, with the $Li^+$ electrolyte 735 shuttling $Li^+$ between the Li metal plate gate 740 and the SNO layer 720, Li intercalation of SNO could proceed when a large enough positive bias is applied to the Li metal gate 740.

The change of the sheet resistance of SNO on Li intercalation was measured. The pristine SNO showed a sheet resistance of 120 Ωper square and it increased to above $10^6$ Ωper square with 15 min gating at 1.5 V. When the gating duration reaches 2 hours at 1.5 V bias, the sheet resistance was above $10^7$ Ωper square. Drastic optical transition was also noted along with the resistance switching. Thus, both the electrical and optical phase transitions of SNO with Li intercalation was very similar to what was seen in the hydrogenation experiments described above.

In summary, it has been disclosed that dopant-driven phase transitions of unprecedented magnitude can be induced in correlated metal oxides by changing their chemical composition, rather than temperature. In some embodiments, the chemical composition of the correlated metal oxide is changed by reversibly introducing dopant ions and charge carriers into the correlated metal oxide. For example, proton doping of a nickelate can modulate its resistance by nearly eight orders of magnitude at and above room temperature and is non-volatile.

A solid state proton-gated transistor that was successfully built has been disclosed. Such a transistor sheds light on the mechanism of resistance modulation and has potential to be of relevance to a number of applications, including without limitation adaptive or neural circuits. The results introduce nickelates as semiconductors worthy of consideration for emerging electronic devices.

Further details, embodiments, features and advantages of the present application are set forth in "Colossal Resistance Switching and Band Gap Modulation in a Perovskite Nickelate by Electron Doping," Nature Communications 5, Article number: 4860, Sep. 3, 2014" by J. Shi, Y. Zhou, and S. Ramanathan. The content of this article is incorporated herein by reference in its entirety. A list of references is found at the end of this paper. The contents of all listed references are incorporated herein by reference in their entireties.

The components, steps, features, objects, benefits and advantages that have been disclosed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. Many other applications of the disclosed systems and methods are also possible.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure.

In the present application, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

What is claimed is:

1. A system comprising:
    a film of samarium perovskite nickelate, the film of samarium perovskite nickelate having at least one catalyst electrode deposited onto a surface thereof;
    the film of samarium perovskite nickelate including a plurality of dopant ions and a plurality of electronic carriers introduced therein so as to chemically induce a non-volatile increase in resistivity of the samarium perovskite nickelate;
    wherein the non-volatile increase in resistivity is between three and eight orders of magnitude.

2. The system of claim 1, wherein the catalyst electrode comprises a hydrogen catalyst electrode.

3. The system of claim 2, wherein the hydrogen catalyst comprises one of; Pt (platinum); and Pd (palladium).

4. The system of claim 1, wherein the dopant ions and the electronic carriers have been dissociated from one or more dopant molecules, and
    wherein the dopant molecules comprise hydrogen, and the dopant ions comprise protons.

5. The system of claim 1, wherein the catalyst electrode is non-porous.

6. The system of claim 1, wherein the catalyst electrode is porous.

7. The system of claim 4, wherein the dopant ions and the electronic carriers have been dissociated from the dopant molecules, upon annealing of the film of samarium perovskite nickelate in a chamber containing the dopant molecules.

8. The system of claim 7, wherein the dopant molecules comprise lithium, and the dopant ions comprise lithium ions.

9. The system of claim 7, further comprising:
    a layer grown on top of the film of samarium perovskite nickelate, wherein the layer is conductive for the dopant ions but insulating for the electronic carriers;
    a gate electrode that is permeable to the dopant ions, the gate electrode configured to dissociate the dopant molecules so as to cause the dopant ions to diffuse into the film of samarium perovskite nickelate and into the layer;
    wherein the at least one catalyst electrode comprises a source and a drain; and
    wherein the system is a transistor.

10. The system of claim 9, wherein the dopant molecules comprise hydrogen, the dopant ions comprise protons, and the layer comprises a proton conductive layer that is also an electron insulator; and
    wherein the gate electrode is a proton-permeable gate electrode.

11. The system of claim 10, wherein the proton conductive layer comprises yttrium-doped barium zirconate (BYZ).

12. The system of claim 10, wherein the proton-permeable gate electrode comprises evaporated Pd.

13. The system of claim 1, wherein the chemical induction of the non-volatile increase in resistivity of the samarium perovskite nickelate includes a reduction of the valence state of Ni (nickel) in the samarium perovskite nickelate, from $Ni^{3+}$ to $Ni^{2+}$.

14. The system of claim 13, wherein the reduction of the valence state of Ni in the samarium perovskite nickelate occurs through a reversible electrochemical process given by:

$$Sm^{3+}+Ni^{3+}3O^{2-}H^{+}+e^{-} \leftrightarrow Sm^{3+}+Ni^{2+}2O^{2-}+OH^{-}.$$

* * * * *